United States Patent
Ootsuka et al.

(10) Patent No.: US 10,507,414 B2
(45) Date of Patent: Dec. 17, 2019

(54) REHEATING COLLECTION DEVICE FOR GAS PHASE PROCESS

(71) Applicant: IHI Corporation, Koto-ku (JP)

(72) Inventors: Yuuta Ootsuka, Tokyo (JP); Yasutomo Tanaka, Tokyo (JP); Wataru Kubota, Tokyo (JP); Masato Ishizaki, Tokyo (JP)

(73) Assignee: IHI Corporation, Koto-ku (JP)

( * ) Notice: Subject to any disclaimer, the term of this patent is extended or adjusted under 35 U.S.C. 154(b) by 0 days.

(21) Appl. No.: 16/239,589

(22) Filed: Jan. 4, 2019

(65) Prior Publication Data

US 2019/0134545 A1    May 9, 2019

Related U.S. Application Data

(63) Continuation of application No. PCT/JP2017/035784, filed on Oct. 2, 2017.

(30) Foreign Application Priority Data

Oct. 14, 2016    (JP) .................................. 2016-202313

(51) Int. Cl.

| | | |
|---|---|---|
| *B01D 45/08* | (2006.01) | |
| *B01D 53/00* | (2006.01) | |
| *B01D 53/74* | (2006.01) | |
| *C23C 16/44* | (2006.01) | |
| *C01B 32/977* | (2017.01) | |

(Continued)

(52) U.S. Cl.
CPC ........... *B01D 45/08* (2013.01); *B01D 53/005* (2013.01); *B01D 53/70* (2013.01); *B01D 53/74* (2013.01); *C01B 32/977* (2017.08); *C23C 16/44* (2013.01); *C23C 16/4412* (2013.01); *H01L 21/205* (2013.01); *B01D 2257/553* (2013.01); *B01D 2257/556* (2013.01); *B01D 2258/0216* (2013.01); *C23C 2222/20* (2013.01)

(58) Field of Classification Search
None
See application file for complete search history.

(56) References Cited

U.S. PATENT DOCUMENTS

| 5,753,891 A | 5/1998 | Iwata et al. |
|---|---|---|
| 2002/0056311 A1 | 5/2002 | Nomura et al. |

(Continued)

FOREIGN PATENT DOCUMENTS

| JP | 8-124866 | 5/1996 |
|---|---|---|
| JP | 10-266957 | 10/1998 |

(Continued)

OTHER PUBLICATIONS

Nagasawa et al.—JP5244974B2—translated document (Year: 2013).*

(Continued)

*Primary Examiner* — Jelitza M Perez
(74) *Attorney, Agent, or Firm* — Oblon, McClelland, Maier & Neustadt, L.L.P.

(57) ABSTRACT

A reheating collection device for a gas phase process is provided with a container elongated in an axial direction along an axis to define a chamber, an inflow path and an exhaust path respectively in communication with the chamber and apart in the axial direction from each other, and a heater heating the chamber between the inflow path and the exhaust path.

6 Claims, 9 Drawing Sheets

(51) Int. Cl.
  *B01D 53/70* (2006.01)
  *H01L 21/205* (2006.01)

(56) References Cited

U.S. PATENT DOCUMENTS

| | | |
|---|---|---|
| 2003/0172713 A1 | 9/2003 | Nomura et al. |
| 2004/0200214 A1 | 10/2004 | Nomura et al. |
| 2013/0061969 A1 | 3/2013 | Koike |

FOREIGN PATENT DOCUMENTS

| | | | | |
|---|---|---|---|---|
| JP | 2002-206480 | | 7/2002 | |
| JP | 2003-209100 | | 7/2003 | |
| JP | 2007-152307 | | 6/2007 | |
| JP | 2007-162108 | | 6/2007 | |
| JP | 2008-161863 | | 7/2008 | |
| JP | 2009-195787 | | 9/2009 | |
| JP | 2013-62362 | | 4/2013 | |
| JP | 5244974 B2 | * | 7/2013 | ............ F16L 53/00 |
| JP | 2016-13965 | | 1/2016 | |
| JP | 2016-13966 | | 1/2016 | |
| WO | WO 2010/140207 A1 | | 12/2010 | |
| WO | WO-2010140207 A1 | * | 12/2010 | ............ F16L 53/00 |

OTHER PUBLICATIONS

Nagawasa, K. JP5244974B2 equivalent to WO2010140207A1—translated document (Year: 2013).*
International Search Report dated Dec. 12, 2017 in PCT/JP2017/035784, filed on Oct. 2, 2017 ( with English Translation).
Written Opinion dated Dec. 12, 2017 in PCT/JP2017/035784, filed on Oct. 2, 2017.

* cited by examiner

REHEATING COLLECTION DEVICE FOR GAS PHASE PROCESS

CROSS-REFERENCE TO RELATED APPLICATIONS

This application is a Continuation Application of PCT International Application No. PCT/JP2017/035784 (filed Oct. 2, 2017), which is in turn based upon and claims the benefit of priority from Japanese Patent Application No. 2016-202313 (filed Oct. 14, 2016), the entire contents of which are incorporated herein by reference.

BACKGROUND

Technical Field

The disclosure herein relates to a device for reheating exhaust gas in gas phase processes to collect solid phase substances therefrom.

Background Art

For the purpose of production of composite materials or coating formation, various chemical vapor phase reaction methods are being used. As application to production of fiber reinforced composite materials from inorganic fibers of carbon or silicon carbide for instance, use of chemical vapor infiltration (CVI) methods is under study. Further, as application to surface treatment on metal or inorganic substance, chemical vapor deposition (CVD) methods are widely used.

Exhaust gas in these processes contains unreacted ingredient gas and various by-products. In a process of thermally decomposing methyltrichlorosilane ($SiCH_3Cl_3$) to precipitate silicon carbide (SiC) for instance, the exhaust gas contains substances such as methyltrichlorosilane, hydrogen chloride and hydrogen. Because some of these substances might lead to unfavorable results if the untreated exhaust gas is exhausted to the air, generally, this is treated with any proper scrubber and thereafter exhausted out to the exterior.

It is known that, in some processes, components in exhaust gas, if not properly treated, would form secondary depositions in exhaust systems. For instance, Japanese Patent Applications Laid-open No. 2016-13965 and 2016-13966 report that solid chlorosilane polymers are generated from gaseous chrolosilane and adhere on devices and disclose methods for removing them from the devices.

SUMMARY

As the solid phase substance continues being deposited and gradually grows in the exhaust system, it becomes more and more resistive to the gas flow and therefore decreases efficiency of gas exhaustion. In processes to be executed under reduced pressure, generally, as the pressure is controlled by balance between the rate of supplying ingredient gas and the rate of exhaustion by a vacuum pump, unsteadiness in the efficiency of exhaustion would impede pressure control. If it goes too far, the process should be frequently halted and the deposition should be removed. This significantly reduces productivity of the process. Further, some depositions such as chlorosilane polymers as described above would cause unfavorable reaction when in contact with the air. The removed depositions sometimes give rise to some difficulties in its post treatments.

The device disclosed below has been created to solve the aforementioned problems simultaneously.

According to an aspect, a reheating collection device for a gas phase process is provided with a container elongated in an axial direction along an axis to define a chamber, an inflow path and an exhaust path respectively in communication with the chamber and apart in the axial direction from each other, and a heater heating the chamber between the inflow path and the exhaust path.

Preferably, the reheating collection device for the gas phase process is further provided with a baffle structure including one or more baffles and movable in the axial direction within the chamber so as to locate at least one of the baffles in between the inflow path and the exhaust path. More preferably, the one or more baffles comprise a curved plate drawing a spiral about the axis or a plurality of flat or curved plates. Still more preferably, the baffle structure further comprises a support body movable in the axial direction, the support body consisting of a bar, a polygonal column, or a cylinder extending in the axial direction within the chamber, and the one or more baffles are a plurality of plates independent of each other, the plates being supported by the support body so as to move together with the support body. Yet preferably, the container is so dimensioned that the chamber includes a reaction chamber heated by the heater, and a stand-by chamber and an escape chamber respectively in communication with the reaction chamber and elongated outward from the reaction chamber in the axial direction to have the reaction chamber interposed therebetween, and the baffle structure is movable throughout the stand-by chamber, the reaction chamber and the escape chamber. Alternatively preferably, the inflow path and the exhaust path are so directed as to be not parallel with the axial direction to establish communication with the chamber.

DESCRIPTION OF EMBODIMENTS

Exemplary embodiments will be described hereinafter with reference to the appended drawings.

Figure 1:
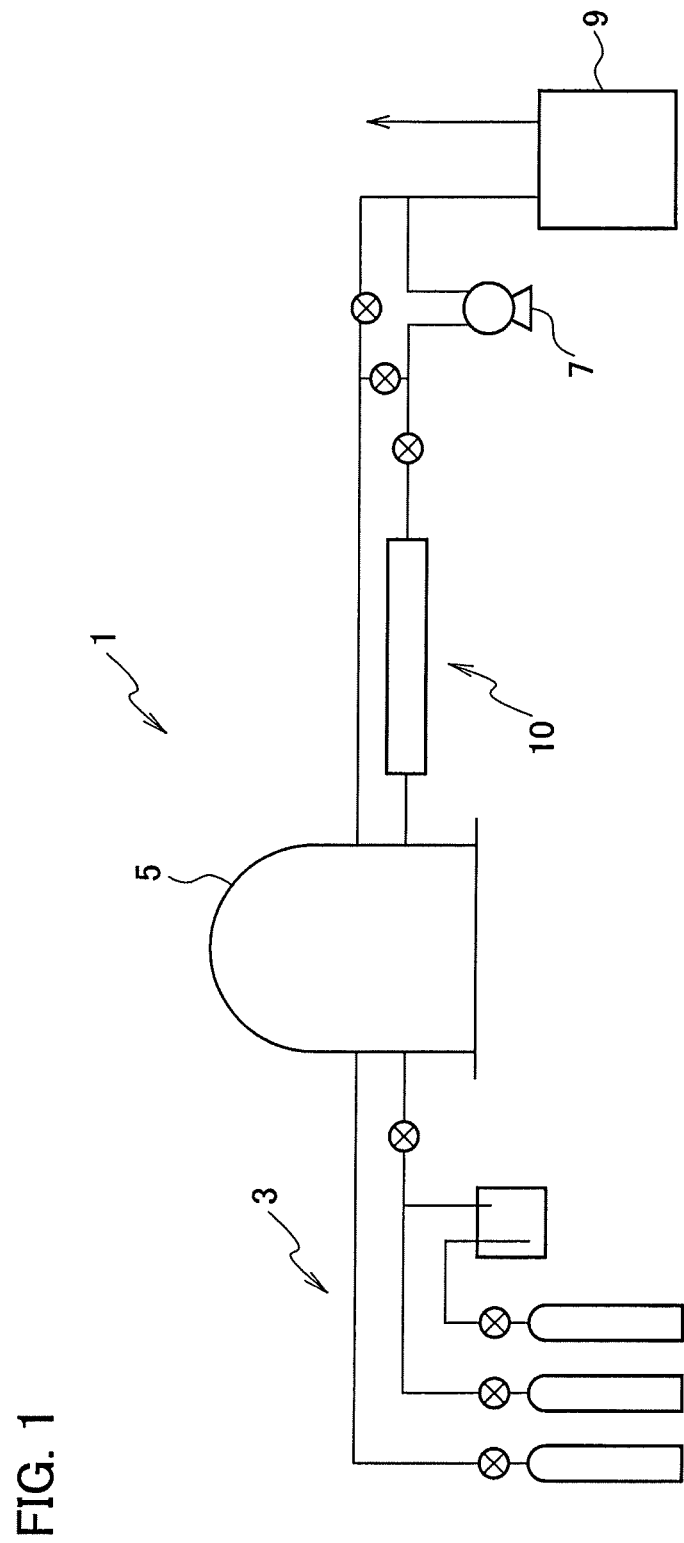
FIG. 1 is a schematic block diagram of a chemical vapor processing device.

Referring to FIG. 1, a chemical vapor processing device for a chemical vapor infiltration (CVI) method or a chemical vapor deposition (CVD) method is provided with a gas supplier 3, a reaction container 5 in communication therewith, a vacuum pump 7 for depressurizing the interior of the reaction container 5, and an exhaust scrubber 9 for treating the exhaust gas therefrom, for instance.

A plurality of gas cylinders respectively storing gas independently may be connected to the gas supplier 3 for instance, and the respective cylinders supply purging gas, ingredient gas, and such for instance to the reaction container 5. Gases after being used in reaction are introduced into the exhaust scrubber 9, treated therein and thereafter exhausted out to the air. In a case where the reaction is executed under reduced pressure, the pressure is regulated by balance between the supply rate of the ingredient gas and the exhaust rate by the vacuum pump 7.

The reheating collection device 10 is connected to the exhaust system of the chemical vapor processing device 1, preferably to any location upstream of the vacuum pump 7 and the exhaust scrubber 9, and is used for treating the exhaust gas. As the reheating collection device 10, by reheating the unreacted ingredient gas or any by-products, collects them as safe solid phase substances on baffles, deposition of chlorosilane polymers onto the exhaust system is prevented and load on the scrubber 9 is reduced. Further, while details will be described later again, by gradually moving a baffle structure to change a location of collection, the chemical vapor processing device 1 can be kept in operation continuously for a long time.

The descriptions below will be given with reference to a case where methyltrichlorosilane is included in the exhaust gas as the unreacted ingredient and is thermally decomposed and collected as silicon carbide. Of course, the following embodiments can be applied to any process with any ingredient distinct from those of the descriptions, and are applicable to collection of BN, $Si_3N_4$, $B_4C$ or any rare metals from unreacted ingredient gas or by-products.

Figure 2:
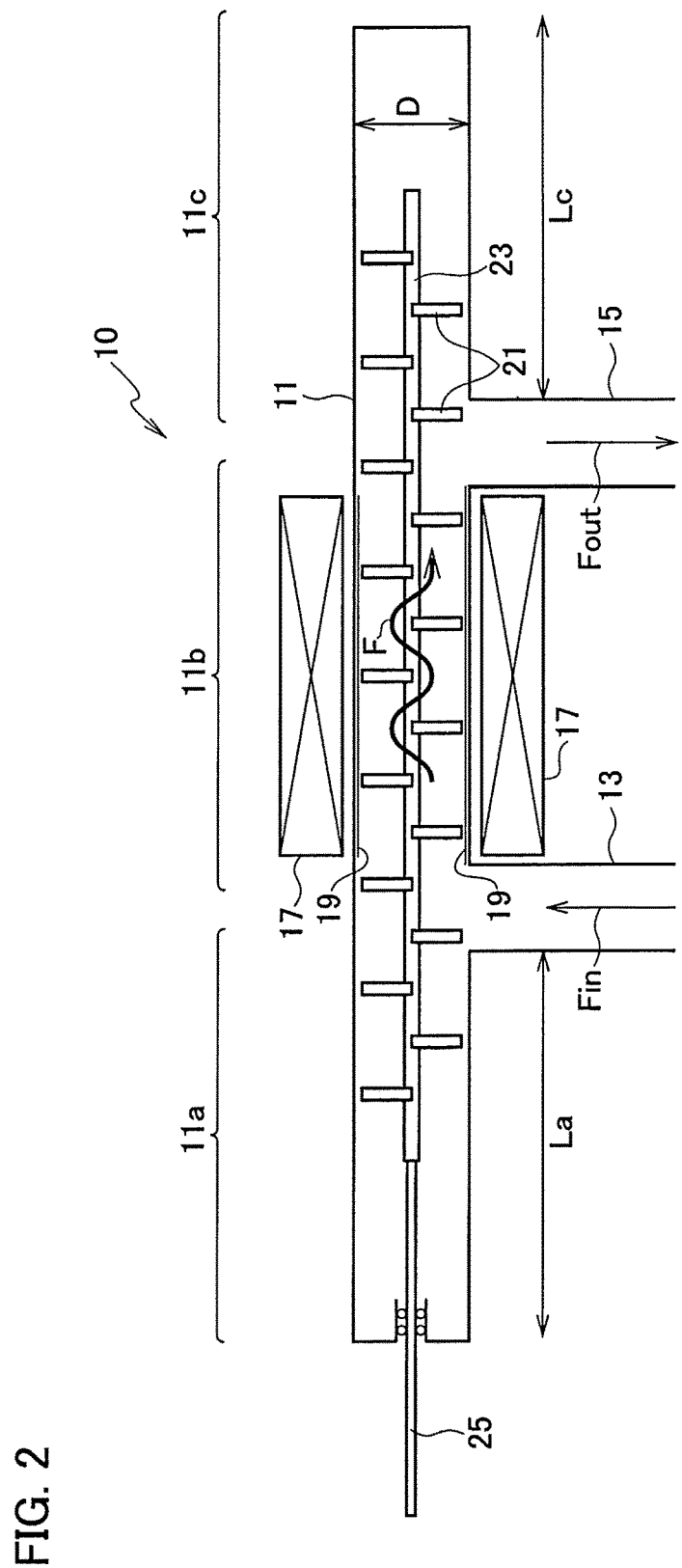
FIG. 2 is a schematic longitudinal sectional view of a reheating collection device applied to the chemical vapor processing.

Referring to FIG. 2, the reheating collection device 10 is in general provided with a container 11 defining a chamber in its interior, an inflow path 13 and an exhaust path 15 respectively in communication with the chamber defined by the container 11, a heater 17 for heating the interior of the container 11, and a baffle structure disposed within the container 11.

The flow indicated by an arrow Fin through the inflow path 13, during meandering or making a spiral motion around the baffle structure as shown in an arrow F, receives heat by the heater 17, reciprocally touches the baffles 21, and is next exhausted as indicated by an arrow Fout out of the exhaust path 15. Methyltrichlorosilane left unreacted in the reaction container 5 would generate solid or semisolid chlorosilane polymers unless not being heated, whereas it is heated by the heater 17 to be decomposed and thereby changes into solid silicon carbide. This is collected and removed by the baffles 21. More specifically, unreacted methyltrichlorosilane is, after being removed or reduced, exhausted out of the exhaust path 15.

The container 11 is formed of any proper material resistive to heating and corrosion, and for instance graphite or silica glass is applicable thereto. The container 11 is elongated in the axial direction along its axis to have a certain length and therefore a chamber in its interior is also elongated in the axial direction. Its external outline may be formed in a cylinder-like shape and as well the chamber in the interior may be columnar, whereas they are not necessarily limited thereto. While larger diameters are beneficial for the container 11 as the flow becomes slower (promoting the reaction more) and the tubing resistance becomes smaller, this causes cost increase, of course. The container 11 is for instance about 30-300 mm in internal diameter D.

The internal chamber of the container 11 in general consists of a reaction chamber 11b between the inflow path 13 and the exhaust path 15, a stand-by chamber 11a and an escape chamber 11c having the reaction chamber 11b interposed therebetween and in communication with both ends thereof.

The reaction chamber 11b is a chamber used for thermally decomposing the exhaust gas and the heater 17 may range over it, or may range from around the inflow path 13 to around the exhaust path 15, so as to heat its entirety. The reaction chamber 11b requires a sufficient length in light of the reaction rate of the decomposing reaction, and the sufficient length depends on the heating temperature, the exhaust gas pressure and the flow speed. An overly long length is disadvantageous in light of the tubing resistance, however. The length of the reaction chamber 11b is thus about 200-2000 mm for example.

The container 11 is elongated outward, by a certain length La, beyond the inflow path 13 in the axial direction and its interior is the stand-by chamber 11a in which an unused part of the baffle structure stands by. While its end is closed, a plunger 25 for moving the baffle structure may be led out therefrom and a gap between the closed end and the plunger 25 should be gas-tightly sealed. As heat by the heater 17 cannot reach this end, this sealing can employ an O-ring of fluoro-rubber or such but may instead employ any heat resistant structure such as a metal bellows. Further, instead of leading out the plunger 25, any traveling means may be housed in the container 11.

The container 11 is elongated outward, by a length Lc, beyond the exhaust path 15 in the axial direction and its interior is the escape chamber 11c in which a used part of the baffle structure escapes. While this end is also closed, for convenience of replacement of the baffle structure, the end may employ an openable door that can provide gas-tight sealing.

La and Lc can be determined in accordance with the required length of the baffle structure.

As being understood already, as both the ends of the container 11 are gas-tightly closed, the flow F of the exhaust gas in the container 11 does not reach the stand-by chamber 11a and the escape chamber 11c and is generally limited within the reaction chamber 11b. Heat is also limited within the reaction chamber 11b. Thus production and deposition of silicon carbide are exclusively limited within the reaction chamber 11b. The internal wall of the container 11 may be covered with any protective member 19 such as a graphite sheet for the purpose of prevention of silicon carbide deposition or such, and the protective member 19 may be limited in the reaction chamber 11b.

The inflow path 13 is a tubing in communication with the reaction container 5 and the exhaust path 15 is a tubing in communication with the exterior. The inflow path 13 and the exhaust path 15 are disposed apart in the axial direction from each other and the length of the reaction chamber 11b depends on the distance therebetween. The inflow path 13 and the exhaust path 15 may be parallel with each other and get connected to the same side of the container 11 as is the example shown in FIG. 2, or one may be at the other side thereof from another. Still alternatively, they may be not parallel with each other and be set in a skew relation. Further, unlike the example shown in FIG. 2, they may intersect the axis of the container 11 to form arbitrary angles distinct from a right angle. However, in need of defining the stand-by chamber 11a and the escape chamber 11c, they may be required not to be parallel with the axis of the container 11.

To the heater 17 applicable is any heating device which has sufficient capacity for heating the gas in the reaction chamber 11b by heat radiation and transfer, and a carbon heater for instance is applicable thereto. Alternatively, a high-frequency induction heater may be used. The heater 17 may be disposed either in the interior or at the exterior of the reaction chamber 11b.

The baffle structure is provided with one or more baffles 21 for regulating the flow F of the exhaust and collecting decomposition products. The baffle structure is totally formed of graphite for instance. To promote collection of silicon carbide, its surface may be covered with carbon felt.

The baffle structure also has a certain length in the axial direction and is elongated within the chambers of the container 11. Further the baffle structure is not secured to the container 11 but is axially movable. Although details will be described later, by gradually moving the baffle structure in the axial direction, location where silicon carbide is collected can be moved. Further in addition to movement in the axial direction, it may be rotated about the axis. This contributes to uniform deposition of silicon carbide.

For the aforementioned purpose, before and during the process of moving, at least one of the baffles 21 may be constantly located within the reaction chamber 11b.

Figure 3A:
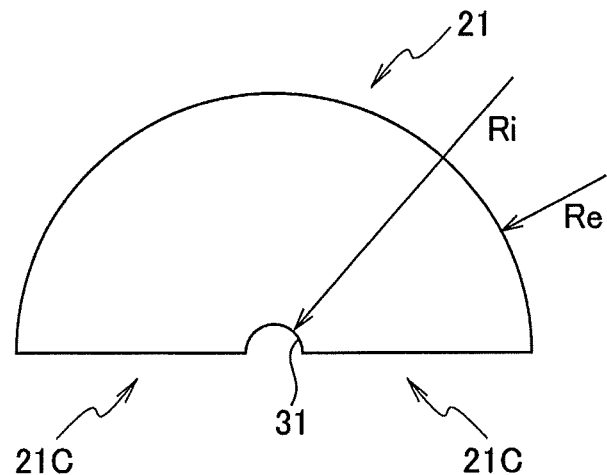
FIG. 3A is a plan view of a baffle among constitutional elements of a baffle structure.
Figure 3B:
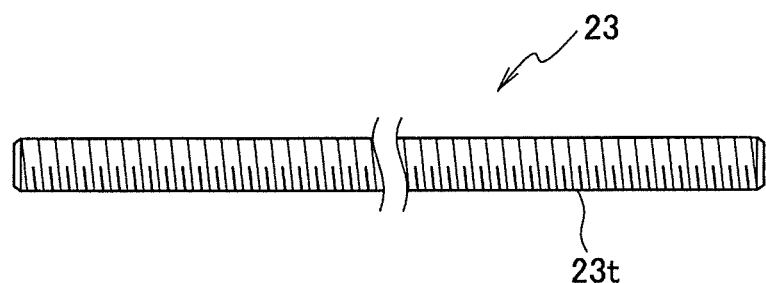
FIG. 3B is a plan view of a support bar among the constitutional elements of the baffle structure.
Figure 3C:
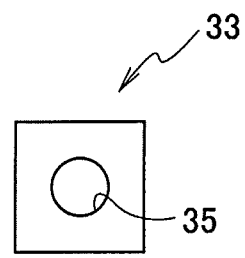
FIG. 3C is a plan view of a nut among the constitutional elements of a baffle structure.

While the baffle structure may take various forms, it is for instance provided with the plurality of baffles 21, each semi-circular and planar as illustrated in FIG. 3A, a support bar 23 ranging over the structure as illustrated in FIG. 3B, and nuts 33, illustrated in FIG. 3C, for securing the baffles 21 to the support bar 23.

Each baffle 21 is in a semi-circular shape in which a cutout 21c in a straight-line shape passing through a center of a circle is cut away from the circle and is further provided with a semi-circular connective hole around the center of the circle. The external radius Re of the baffle 21 is slightly smaller than the internal radius D/2 of the container 11 and the internal radius Ri of the connective hole 31 is so determined as to fit on the outer periphery of the support bar.

Figure 4:
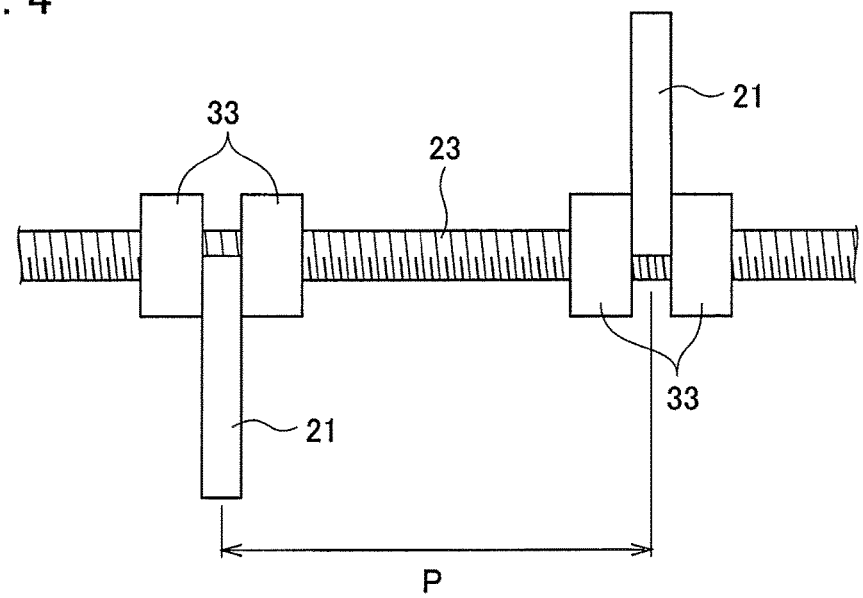
FIG. 4 is a partial plan view of the baffle structure according to an embodiment, showing its assembled state.

The support bar 23 may be in a form of a stud bolt having a screw thread 23t over the entire length thereof. This in combination with the nuts 33 having screw holes 35 can secure the baffles 21 in arbitrary positions as shown in FIG. 4.

The pitch P between baffles 21 is about 20-200 mm for instance but may be properly increased or decreased in accordance with the pressure and the flow speed of the exhaust in the reaction chamber 11b.

Figure 5A:
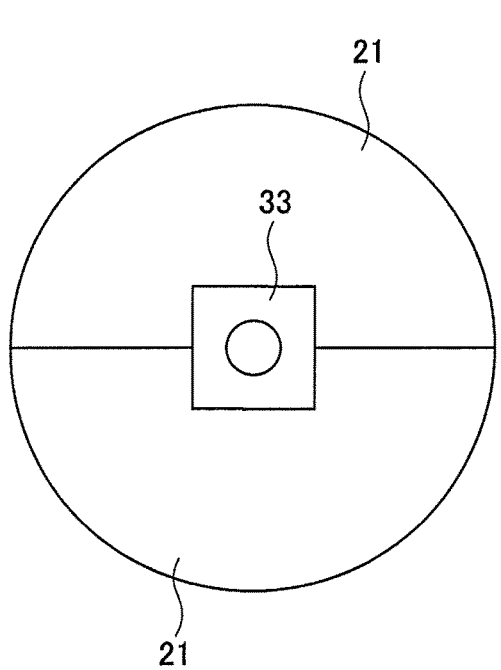
FIG. 5A is a drawing showing an example of an arrangement of the baffle.

The baffles 21 are so arranged as to make the flow F of the exhaust meander therearound. For instance, as shown in FIG. 5A, one baffle 21 is disposed at a side opposed to a side of adjacent another baffle 21 with respect to the axis, more specifically at a location turned 180 degrees from the latter around the axis. As illustrated in FIG. 2, the flow F deflected in one direction by one baffle 21 is next deflected in another direction by the next baffle 21, and, by repeating such deflections, the flow F makes a meandering motion in the reaction chamber 11b. The meandering flow F elongates the residence time of the exhaust in the reaction chamber 11b and increases chances that the flow F gets contact with the baffles 21. Therefore this is advantageous in efficiently collecting the decomposition products.

Figure 5B:
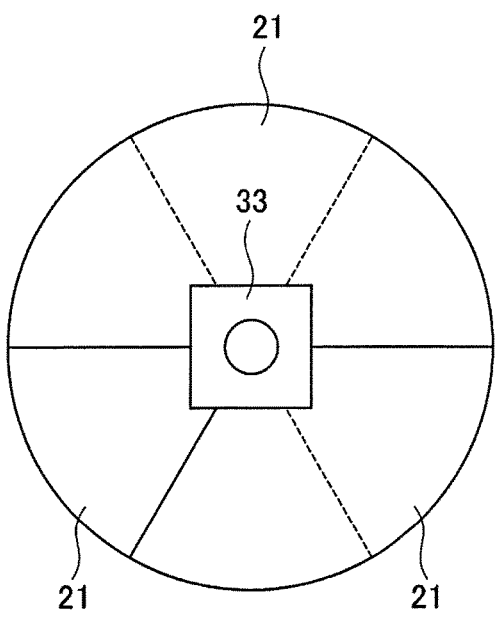
FIG. 5B is a drawing showing another example of an arrangement of the baffle.

Alternatively, as shown in FIG. 5B, one baffle 21 may be disposed at a location turned 120 degrees from adjacent another baffle 21 around the axis, and still another adjacent baffle 21 may be disposed at a location further turned 120 degrees therefrom. Of course, it is not limited to 120 degrees but the angle may be arbitrarily selected. Such arrangement can set the flow F into a meandering motion and as well into a spiral motion. Such arrangement is also advantageous in effectively collecting the decomposition products.

Figure 6A:
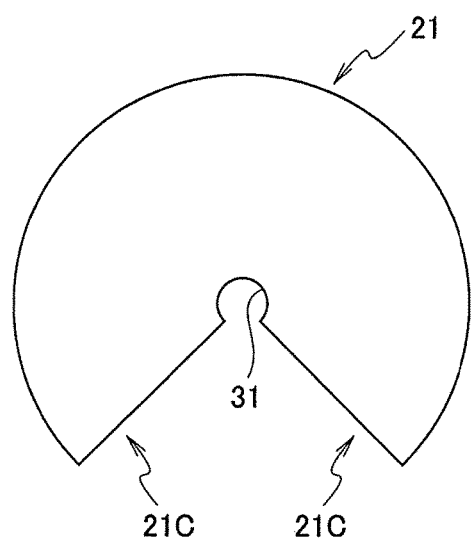
FIG. 6A is a drawing showing another example of the baffle.
Figure 6B:
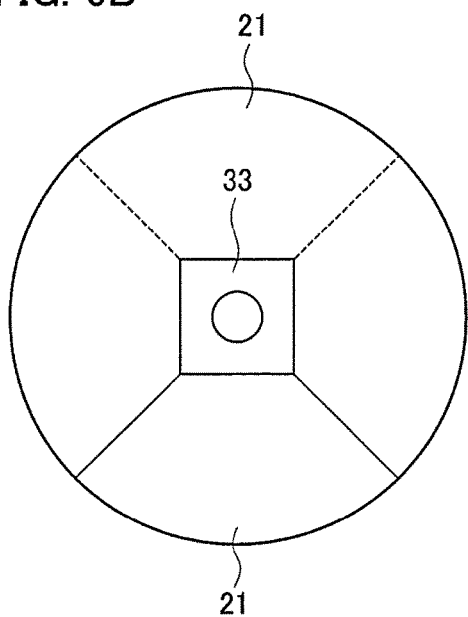
FIG. 6B is a drawing showing an arrangement of the baffle according to another example.

Alternatively, each baffle 21 is not in a semi-circular shape but has a cutout 21c in a fan-like shape to form a fan as shown in FIG. 6A. The cutout 21c is for instance ¼ of the circle, but may be more or less than that. In this example also, the baffles 21 may be arranged as shown in FIG. 6B to set the flow into a meandering or spiral motion.

Figure 7A:
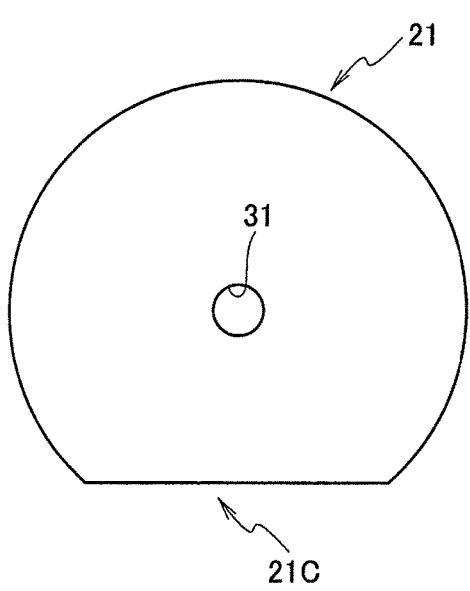
FIG. 7A is a drawing showing still another example of the baffle.
Figure 7B:
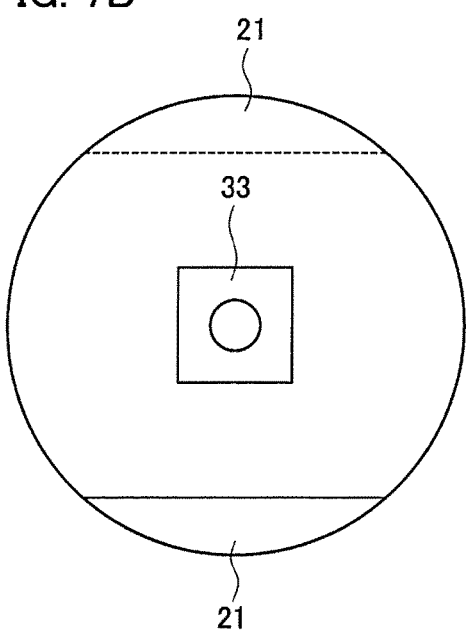
FIG. 7B is a drawing showing an arrangement of the baffle according to still another example.

Still alternatively, the cutout 21c is not in a fan-like shape but in a linear shape not passing through the center of the circle as shown in FIG. 7A. Also in this example, the baffles 21 may be arranged as shown in FIG. 7B to set the flow into a meandering or spiral motion.

Figure 8A:
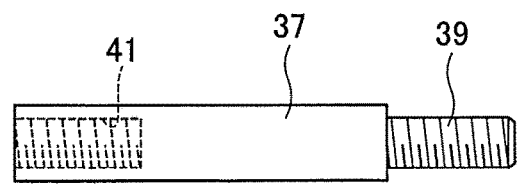
FIG. 8A is a plan view of a support bar of a baffle structure according to another example.

While the support bar in the example of FIG. 3B is a single unitary bar throughout the length thereof, instead applicable support bars 37 may be relatively short bars connectable with each other, which constitute a long support bar when connected, as shown in FIG. 8A. This is advantageous in increasing or decreasing its length in accordance with the need for the length of the baffle structure. The outer peripheries of the support bars 37 may be smooth columnar or in a prism shape. Ends thereof are relatively short bolt sections 39 projecting therefrom and another ends are respectively provided with screw holes 41 corresponding thereto. The bolt sections 39 can be screwed in the screw holes 41.

Figure 8B:
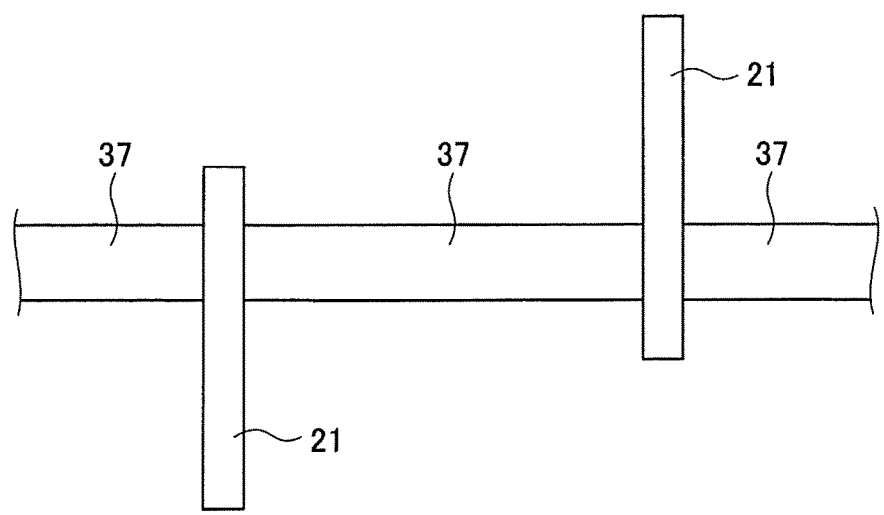
FIG. 8B is a plan view of the baffle structure according to another example.

The plurality of support bars 37 allows fixation of the baffles 21 without nuts. Specifically, as shown in FIG. 8B, when the support bars 37 are connected to each other with interposing the baffles 21 therebetween, a long baffle structure with fixed baffles 21 can be produced.

Figure 9:
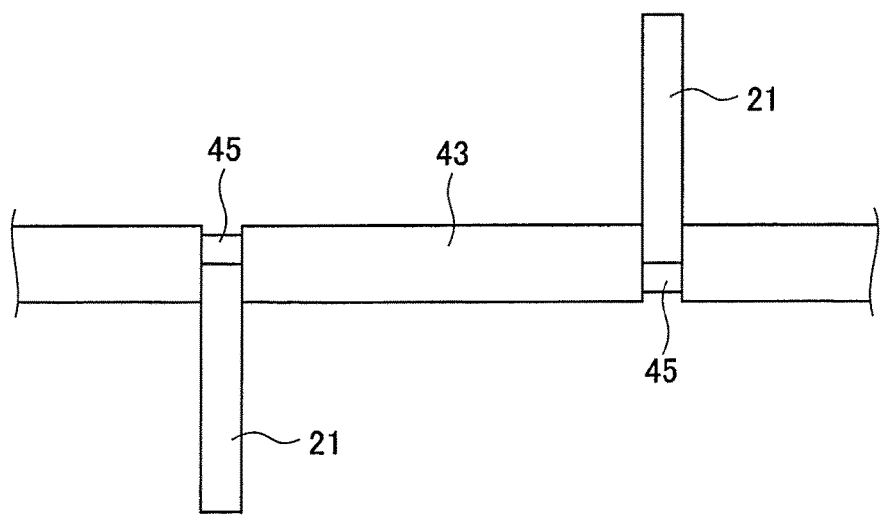
FIG. 9 is a plan view of a baffle structure according to still another example.

Still alternatively, there's no need to fix the baffles 21 but support of them may be based on fitting. According to an example shown in FIG. 9, the support bar 43 has circumferential grooves 45 that fit with the baffles 21. As the baffles 21 respectively fit in the grooves 45, the baffle structure is constituted. Because no certain force acts on the baffles 21 and silicon carbide deposited thereon functions as glue to fix them, firm fixation is not indispensable.

In place of, or in addition to, fitting, use of adhesive or such is applicable, and, for adhesion, ceramic adhesive such as that formed of inorganic polymer for instance is applicable.

Figure 10A:
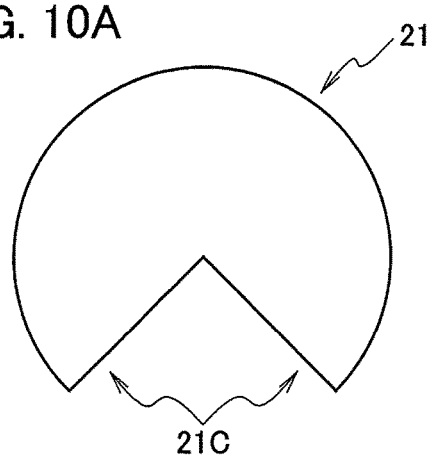
FIG. 10A is a plan view of a baffle according to a first example of another embodiment.
Figure 10B:
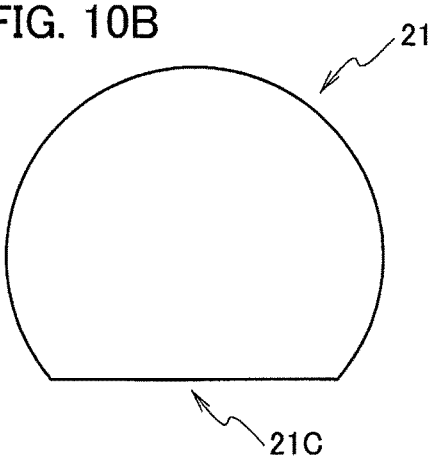
FIG. 10B is a plan view of a baffle according to a second example of another embodiment.

While the aforementioned embodiments use the support bars passing through the centers of the baffle structures, the structure for supporting the baffles is not limited to a bar but any other structure such as a polygonal column or a cylinder for instance is applicable. In this case, the baffles 21 are not necessary to have connective holes as illustrated in FIG. 10A and FIG. 10B.

Figure 10C:
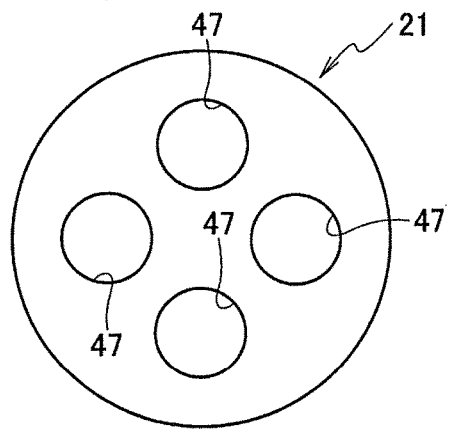
FIG. 10C is a plan view of a baffle according to a third example of another embodiment.
Figure 10D:
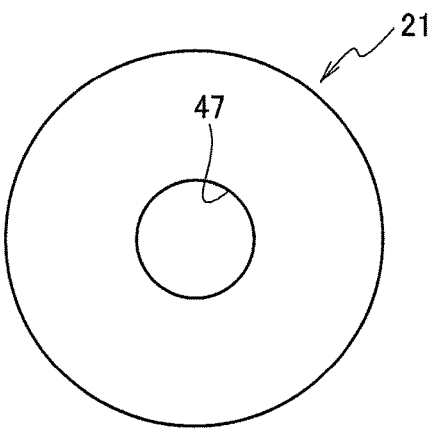
FIG. 10D is a plan view of a baffle according to a fourth example of another embodiment.
Figure 10E:
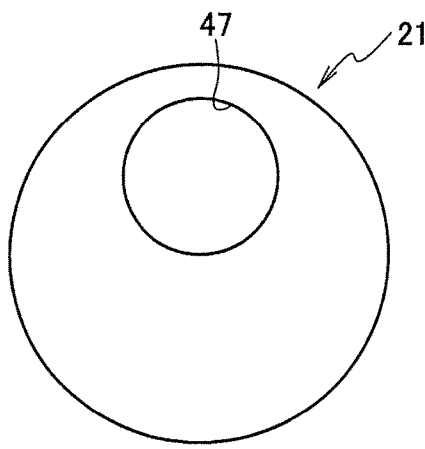
FIG. 10E is a plan view of a baffle according to a fifth example of another embodiment.

Still alternatively, in place of the cutout 21c, through-hole(s) 47 that allow the exhaust gas to pass therethrough as illustrated in FIGS. 10C through 10E may be used. As in FIG. 10C, a plurality of through-holes 47 in an axially symmetric or asymmetric arrangement may penetrate the baffle 21 or a single through-hole 47 around, or deviated from, the center may penetrate the baffle 21 as shown in FIG. 10D or 10E.

As with the embodiments described above, to promote the meandering or spiral motion of the flow F, through-holes 47 on adjacent baffles 21 may be staggered from each other, or heterogenous baffles such as a combination of the baffle of FIG. 10C and the baffle of FIG. 10D may be combined.

Figure 11A:
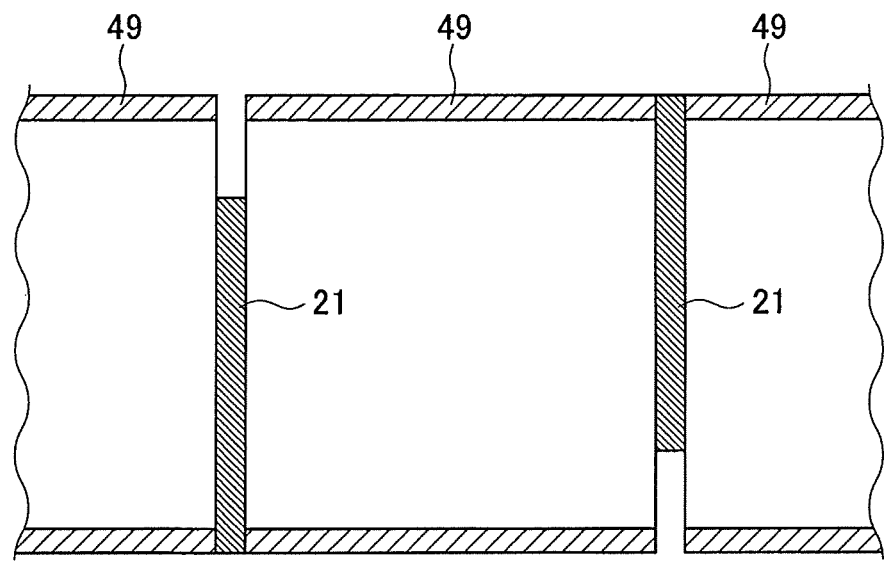
FIG. 11A is a partial sectional plan view of a baffle structure according to an embodiment, showing an assembled state.
Figure 11B:
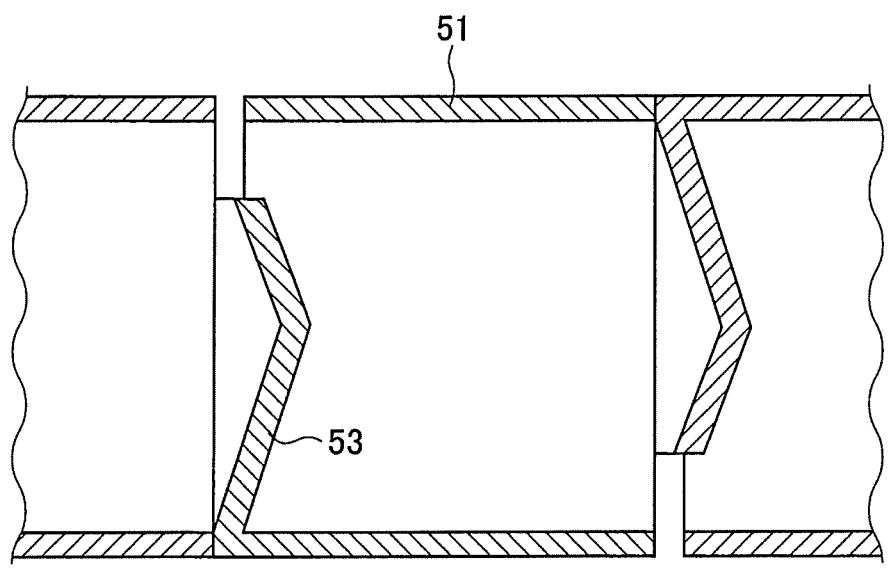
FIG. 11B is a partial sectional plan view of a baffle structure according to an embodiment, showing an assembled state.

FIG. 11A shows an example that a plurality of cylinders 49 put a plurality of baffles 21 therebetween to constitute a baffle structure. Peripheral faces of the cylinders are not closed but opened at sides toward the inflow path 13 and the exhaust path 15. While the cylinders and the baffles are separate bodies in this example, they may form a unitary body as shown in FIG. 11B. A monolithic body may be produced by machining out of a bulky material or sintered up from plural bodies, or cylinder sections 51 and baffle section 53 may be independently produced and thereafter combined.

The baffles 21 or the baffle sections 53 may be flat but may formed as curved plates for the purpose of rectifying the flow F. FIG. 11B illustrates an example that the baffle sections 53 are formed in axially projecting conical shapes.

Figure 12:
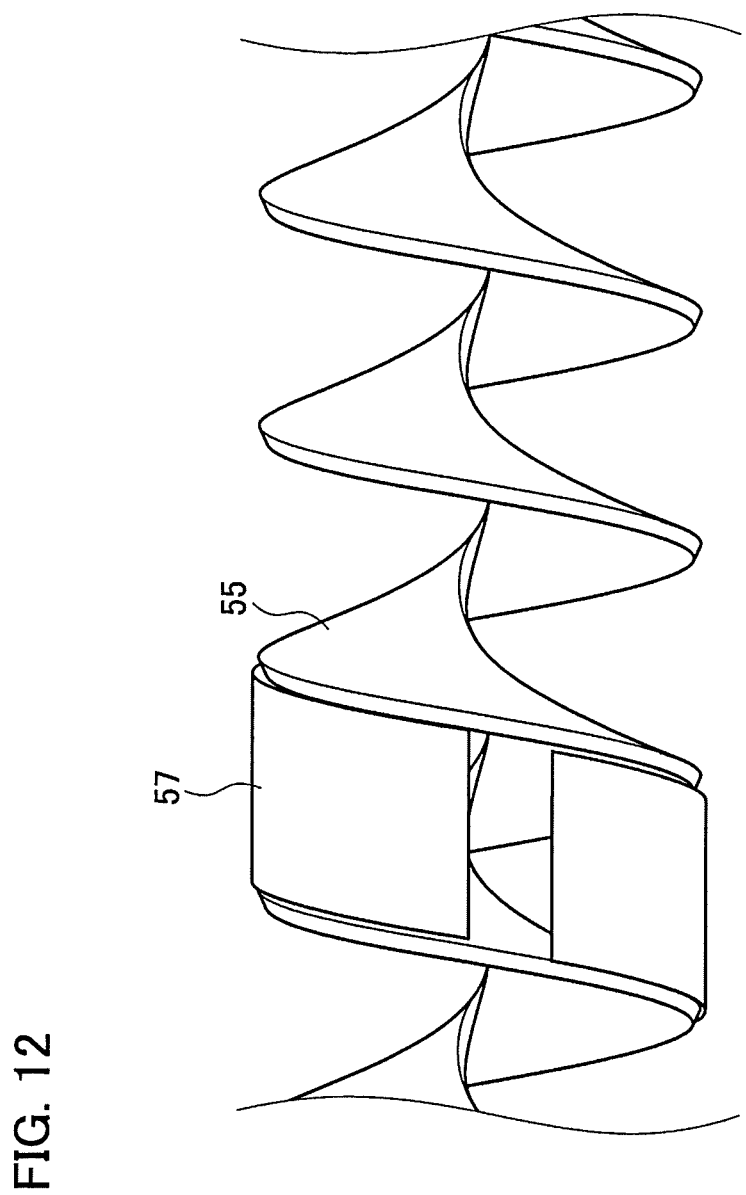
FIG. 12 is a plan view of a baffle of a curved plate drawing a spiral.

Further alternatively, as illustrated in FIG. 12, the whole of the baffle structure may be a curved plate drawing a spiral about the axis. It may be constituted only of the baffle 55 drawing the spiral curved surface, or any spacers may cover its outer peripheries. Such structures of course set the flow F into a spiral motion.

Referring mainly to FIG. 2, collection of silicon carbide by the reheating collection device 10 will be described hereinafter.

In the early stage of the operation, part of the baffle structure is located within the reaction chamber 11b, the rest thereof is housed in the stand-by chamber 11a, and the escape chamber 11c is vacant. After evacuating the entirety of the chemical vapor processing device 1 by means of the vacuum pump 7, by supplying the ingredient gas therein, the pressure in the reaction container 5 is regulated to be constant, in a range of 100 Pa through 5 kPa for instance. As described already, the pressure is determined by three factors of the rate of supplying the gases, the rate of exhaustion by the vacuum pump 7, and the tubing resistance.

As the reaction chamber 11b is heated by the heater 17, radiation thereof raises temperatures of the baffle structure and the exhaust together. As overly low temperatures create insufficient reaction efficiency and rather promote formation of chlorosilane polymers, the temperature of the baffle structure is preferably 1200 degrees C. or higher.

The exhaust gas after being used for the reaction in the reaction container 5 contains hydrogen chloride and hydrogen as by-products, and unreacted methyltrichlorosilane, and flows through the inflow path 13 into the reaction chamber 11b. The exhaust gas is made into a meandering or spiral motion by the baffle structure and repeatedly gets contact with the baffles, and then methyltrichlorosilane is decomposed into silicon carbide and collected on the baffles. If the temperature rise is sufficient, the process must not create chlorosilane polymers. Unreacted methyltrichlorosilane is removed or reduced and thereafter the exhaust gas is exhausted out through the exhaust path 15.

If the baffle structure is kept fixed, silicon carbide adheres on the baffles and becomes gradually thicker and then the tubing resistance in the reheating collection device 10 increases. This is a source for increasing the pressure in the reaction container 5 and, if it exceeds the capacity of regulation by the supply rate of the gas and the exhaust rate of the vacuum pump 7, the chemical vapor processing cannot proceed any more.

According to the present embodiment, by pressing the plunger 25, the baffle structure gradually and continuously moves toward the escape chamber 11c. The traveling speed is for instance about 1 mm/min but can be increased or decreased properly according to the reaction rate or the growth rate of the decomposition products. The part where thick deposition grows thereby escapes into the escape chamber 11c and new part gets into the reaction chamber 11b. The tubing resistance can be thereby regulated to be constant.

Collection of silicon carbide can be continued until the top end of the baffle structure reaches the end of the escape chamber 11c. During this process, the pressure in the reaction container 5 can be readily regulated to be constant.

After finishing the processing, the entirety of the chemical vapor processing device 1 is purged with proper gas and the reheating collection device 10 is thereafter opened to the air.

Produced silicon carbide is recycled as collected matters on the baffles. As production of chlorosilane polymers is prevented by means of heating, the collected matters can be discarded without any troublesome post-treatments.

While chemical vapor processing often requires very long time, such as 200 hours, continuous operation would last for 20 hours at the longest if a device with fixed baffles is used. Processing must be frequently halted and the baffles are required to be renewed. This seriously reduces productivity. Or, to work on pressure regulation and renewal, some operators reside aside the device by day and night. In contrast in the present embodiment, by using the baffle structure and the container 11 with proper lengths, the device can keep in continuous operation for 200 hours or such long time. Further, the operation can be readily automated and it eliminates the need for work by day and night.

Although certain embodiments have been described above, modifications and variations of the embodiments described above will occur to those skilled in the art, in light of the above teachings.

INDUSTRIAL APPLICABILITY

A reheating collection device is provided, which enables continuous operation and requires no troublesome post-treatments.

What is claimed is:

1. A reheating collection device for a gas phase process, comprising:
   a container elongated in an axial direction along an axis to define a chamber;
   an inflow path and an exhaust path respectively in communication with the chamber and apart in the axial direction from each other;
   a heater heating the chamber between the inflow path and the exhaust path; and
   a baffle structure including one or more baffles and movable in the axial direction within the chamber so as to locate at least one of the baffles in between the inflow path and the exhaust path.

2. The reheating collection device for the gas phase process of claim 1, wherein the one or more baffles comprise a curved plate drawing a spiral about the axis or a plurality of flat or curved plates.

3. The reheating collection device for the gas phase process of claim 1, wherein the baffle structure further comprises a support body movable in the axial direction, the support body consisting of a bar, a polygonal column, or a cylinder extending in the axial direction within the chamber, and
   wherein the one or more baffles are a plurality of plates independent of each other, the plates being supported by the support body so as to move together with the support body.

4. The reheating collection device for the gas phase process of claim 1, wherein the container is so dimensioned that the chamber includes a reaction chamber heated by the heater, and a stand-by chamber and an escape chamber respectively in communication with the reaction chamber and elongated outward from the reaction chamber in the axial direction to have the reaction chamber interposed therebetween, and
   wherein the baffle structure is movable throughout the stand-by chamber, the reaction chamber and the escape chamber.

5. The reheating collection device for the gas phase process of claim 1, wherein the inflow path and the exhaust path are so directed as to be not parallel with the axial direction to establish communication with the chamber.

6. The reheating collection device for the gas phase process of claim 1, wherein the baffle structure further comprises a support body movable in the axial direction, the support body including at least one of a bar, a polygonal column, and a cylinder extending in the axial direction within the chamber, and
   wherein the one or more baffles are a plurality of plates independent of each other, the plates being supported by the support body so as to move together with the support body.

* * * * *